(12) United States Patent
Piesinger

(10) Patent No.: US 9,291,494 B1
(45) Date of Patent: Mar. 22, 2016

(54) DISCHARGE CORONA UV DETECTION IN AC POWER SYSTEMS METHOD AND APPARATUS

(71) Applicant: Gregory Hubert Piesinger, Cave Creek, AZ (US)

(72) Inventor: Gregory Hubert Piesinger, Cave Creek, AZ (US)

( * ) Notice: Subject to any disclaimer, the term of this patent is extended or adjusted under 35 U.S.C. 154(b) by 0 days.

(21) Appl. No.: 14/708,212

(22) Filed: May 9, 2015

(51) Int. Cl.

| | |
|---|---|
| *G01N 21/00* | (2006.01) |
| *G01J 1/04* | (2006.01) |
| *G01J 1/42* | (2006.01) |
| *G01R 31/12* | (2006.01) |
| *H04N 5/353* | (2011.01) |
| *G02B 5/20* | (2006.01) |
| *H04N 5/232* | (2006.01) |
| *H04N 5/04* | (2006.01) |

(52) U.S. Cl.
CPC ............... *G01J 1/044* (2013.01); *G01J 1/429* (2013.01); *G01R 31/1218* (2013.01); *G02B 5/20* (2013.01); *H04N 5/04* (2013.01); *H04N 5/23229* (2013.01); *H04N 5/3532* (2013.01)

(58) Field of Classification Search
CPC ............... G01J 3/02; G01J 3/04; G01J 3/42; G01R 31/12; H04N 5/353; H04N 5/232; H01J 37/32935; G01N 21/64; G01N 21/68; G01N 2015/1037

USPC .................... 356/72–73; 348/296; 250/208.1
See application file for complete search history.

(56) References Cited

U.S. PATENT DOCUMENTS

2011/0222900 A1*  9/2011  Makino ............ G03G 15/0258
399/98

* cited by examiner

*Primary Examiner* — Abdullahi Nur

(57) ABSTRACT

A solar blind corona camera designed specifically for use on 60 Hz or 50 Hz AC power distribution equipment is based on the fact that electrical discharge corona only occurs above some voltage threshold level on the positive and negative voltage peaks of the AC power waveform. Between these peaks, when the AC voltage is below the discharge corona voltage threshold, the electrical discharge and resulting corona are extinguished. An image sensor is used to both capture the corona-plus-ambient light image during the corona period and the ambient light image during the non-corona period. The ambient light image is then subtracted from the corona-plus-ambient light image leaving only the corona light image which is annunciated and displayed along with the ambient light image. This process effectively renders the corona camera solar blind so it can be used both at night and during daylight.

20 Claims, 13 Drawing Sheets

DISCHARGE CORONA UV DETECTION IN AC POWER SYSTEMS METHOD AND APPARATUS

TECHNICAL FIELD OF THE INVENTION

The present invention relates to the field of electric power systems. More specifically, the present invention relates to detecting and viewing ultraviolet (UV) light associated with high voltage discharge corona in AC power systems.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage (345,000 volts phase-to-phase) is delivered to multiple transmission substations at which transformers step this high voltage down to a lower three-phase voltage (69,000 volts phase-to-phase). This 69,000 volt three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120/240 volts for delivery to commercial and residential customers.

Electrical apparatus associated with the generation, transmission, and distribution of high voltage electric power can produce electrical discharge corona when the surrounding air begins to lose insulating qualities. Discharge corona produced by transmission lines, transformers, switches, insulators, bushings, and the like occur when the air surrounding them begins to conduct rather than insulate. The high local electric field around these devices ionizes the air, causes excitation of nitrogen molecules in the air, and leads to an electrical partial discharge and ultraviolet radiation.

Discharge corona generates ozone and nitrogen oxides, which can form corrosive compounds such as nitric acid. These corrosive compounds can significantly reduce the service life of electrical components, cause damage to high voltage insulators, and create radio interference. Electric utility companies attempt to find and correct discharge corona as early as possible to prevent later failures that can cause a power outage to their customers.

Discharge corona emits radiation within the spectral range of about 280 nm to about 400 nm which falls mostly in the UV range and is therefore invisible to the human eye. The spectrum of discharge corona and visible light is illustrated in FIG. 1. Strong discharge corona can show up very faintly to the human eye in total darkness and can also be detected using standard UV cameras. However, sunlight UV masks discharge corona making it difficult or impossible to visibly see or use standard UV cameras in the daytime.

To detect discharge corona in daylight, all modern corona cameras use what are known as "solar blind" filters. UV energy from the sun, at wavelengths shorter than around 280 nm, is completely absorbed by the atmosphere. Therefore, by using a shortpass or bandpass UV filter, solar energy appears dark to UV cameras while discharge corona energy shorter than 280 nm is passed by the solar blind filter. Therefore, solar blind UV cameras can be used both at night and during daytime.

U.S. Pat. No. 8,781,158 discloses a common implementation of essentially all modern solar blind UV cameras. The basic approach is illustrated in FIG. 2 where a separate optical path is provided for the solar blind spectrum and another separate optical path is provided for the visual spectrum. The images from these separate paths are then combined and displayed to the user. This is required so that the exact position of the corona on the electrical component can be determined.

U.S. Pat. No. 7,732,782 discloses an attempt to reduce the complexity of this dual optical path approach by implementing a single optical path approach as illustrated in FIG. 3 in which a dual narrowband filter is used to pass both discharge corona UV energy and visible spectrum energy.

The problem with all current solar blind approaches is that the discharge corona energy in the solar blind spectrum is minuscule so expensive image intensifiers must be used to detect the corona. A typical intensified charge-coupled device (ICCD) includes a photocathode, micro-channel plate, phosphor screen, and CCD image sensor mounted one close behind the other. When light source photons fall onto the photocathode they generate photoelectrons which are accelerated and multiplied inside the micro-channel plate by an electrical voltage. The phosphor screen converts the multiplied electrons back to photons which are received by a camera CCD image sensor for conversion into a digital image. This is the same principle used by many night vision goggles and cameras.

In addition to the ICCD device, solar blind filters and the merging of the UV and visible images typically require expensive optical components and focus/zoom lenses. The result is that these solar blind corona cameras typically cost on the order of $40,000 USD in 2014. Many small utilities simply cannot justify these costs and forgo the benefits of early discharge corona detection.

Accordingly, it is the object of the present invention to provide a new and improved method and apparatus for discharge corona detection in AC power systems that greatly reduces the cost of a corona camera.

It is another object of the present invention to provide long range discharge corona detection in AC power systems so long spans of transmission and distribution lines can be observed from a central location.

It is another object of the present invention to provide stationary automated or semi-automated substation discharge corona detection in AC power systems using programmed auto-patrol (security camera like) observation.

SUMMARY OF THE INVENTION

Briefly, to achieve the low cost objective, the corona camera of the present invention is designed specifically for use on AC power equipment as opposed for use on other sources of UV such as flame detection, forensics, art, science, etc. All US and foreign high voltage AC power distribution systems use either 60 Hz or 50 Hz sinusoidal alternating voltage where the voltage contains one positive peak and one negative peak each cycle. Since discharge corona only occurs at a high threshold voltage, corona only occurs above some voltage threshold level on the positive and negative voltage peaks. Between these peaks, when the AC voltage is below the discharge corona voltage threshold, the electrical discharge and resulting corona is extinguished and only the ambient light (the non-corona background scene) is present.

An image sensor is used to capture both the corona-plus-ambient image during the voltage peaks and the ambient (non-corona) image between the voltage peaks. The ambient image is then subtracted from the corona-plus-ambient image leaving the corona-only image which is annunciated and displayed along with the ambient image.

A shortpass optical filter with a stopband on the order of 400 nm is used prior to the image sensor to remove most of visible light and solar energy. As illustrated in FIG. 1, a 400 nm filter allows most of the corona spectral energy to pass and enough solar spectral energy to pass to view the background or ambient light scene. Therefore, only a single optical path is required to display both the discharge corona and the ambient image.

Low cost CCD or CMOS image sensors can be used in place of expensive image intensifiers by increasing the image sensor integration time.

To further reduce corona camera cost, the image sensor can be combined with a low-cost mirror based optical system instead of with an expensive lenses based system as used on current corona cameras.

For long range discharge corona detection, low cost large aperture reflectors can be used instead of expensive small aperture UV lenses.

For stationary automated detection, the corona camera of the present invention can be mounted on a security camera pan and tilt mount and programmed to sequentially inspect each electrical component of interest.

These and other embodiments are discussed below.

DETAILED DESCRIPTION OF THE PREFERRED EMBODIMENTS

Figure 1:
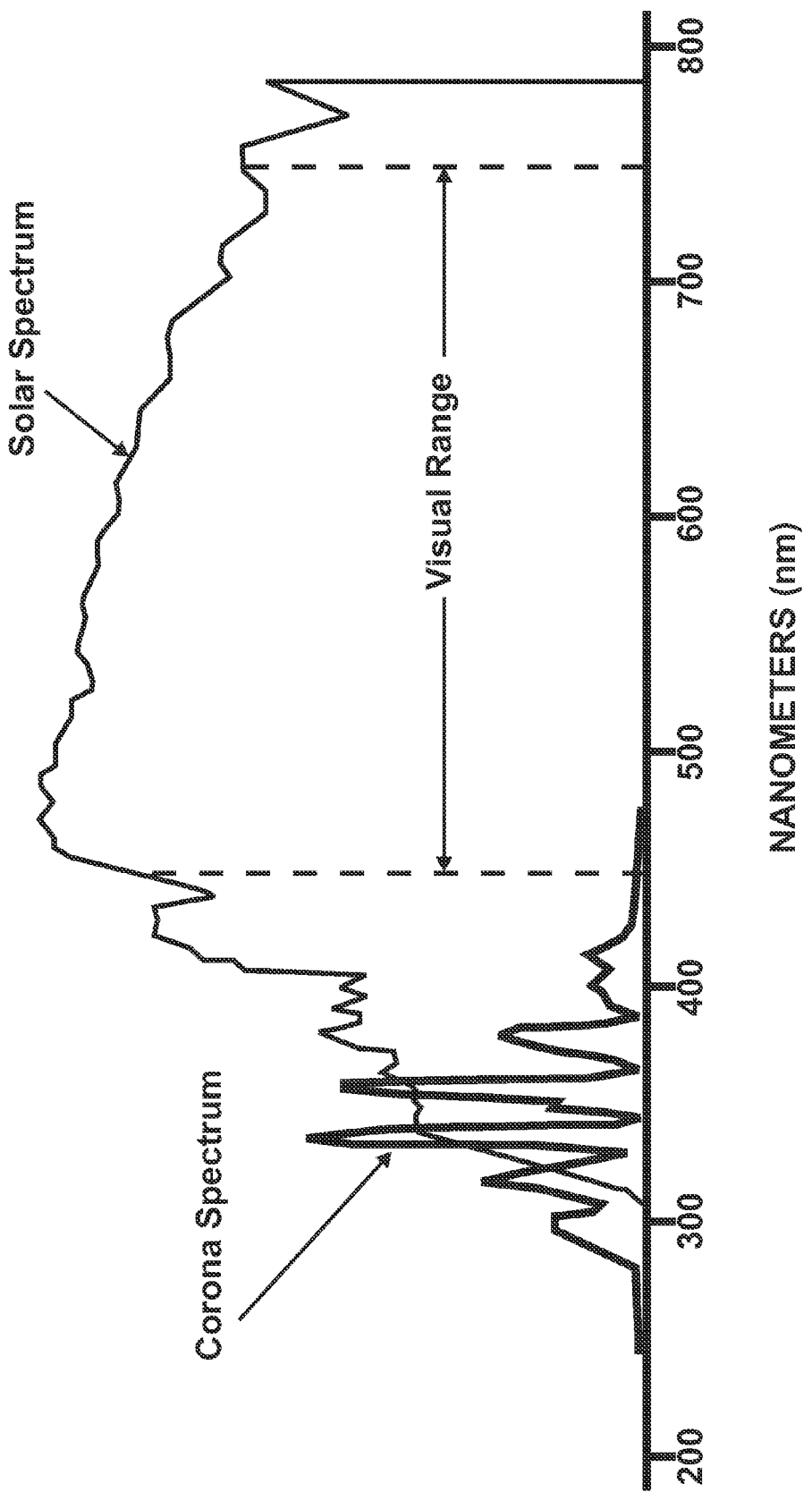
FIG. 1 illustrates corona and solar spectral distributions.
Figure 2:
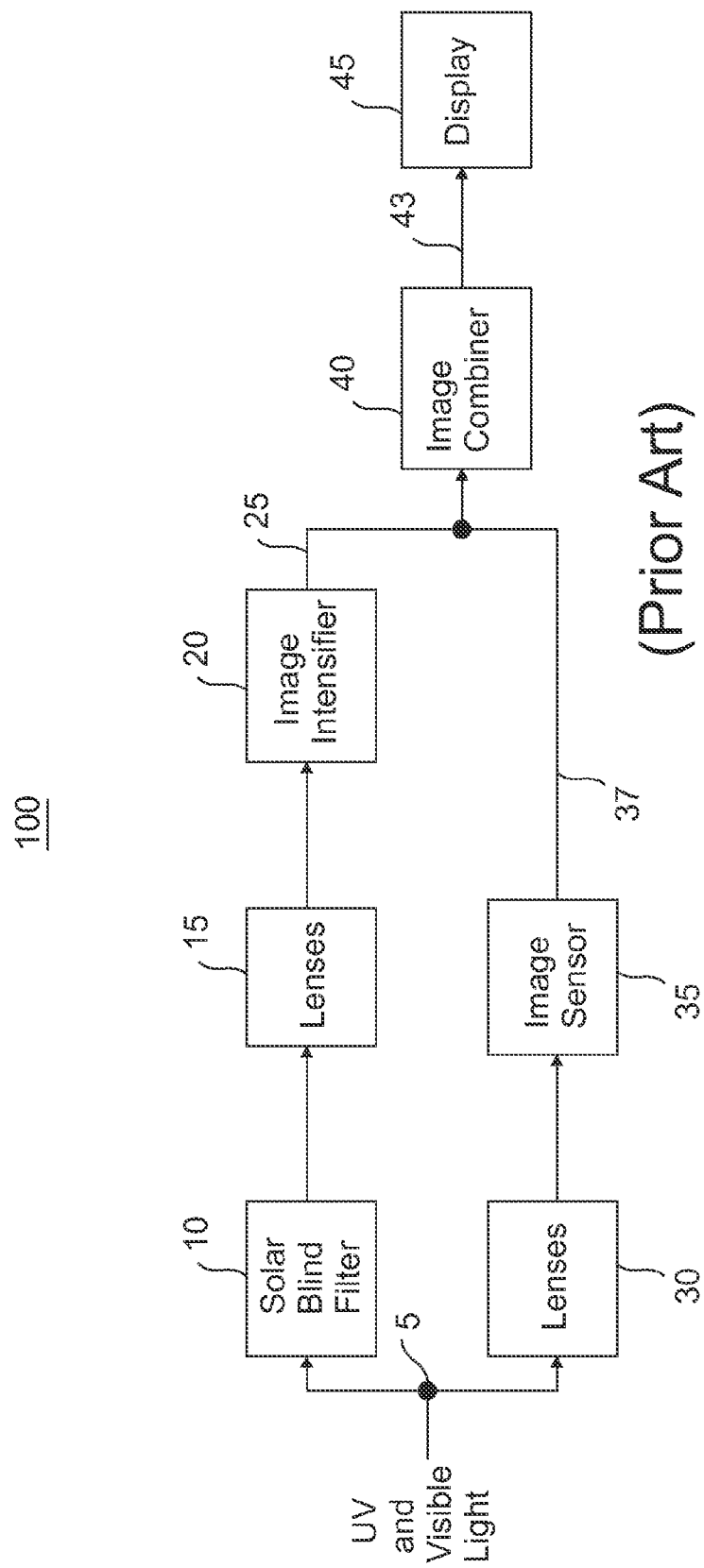
FIG. 2 illustrates a functional block diagram of prior art solar blind corona cameras.

A functional block diagram of current solar blind UV cameras 100 is illustrated in FIG. 2. UV and visible light 5 is received by both the UV optical path and visible path. UV path solar blind filter 10 removes solar UV and visible light and passes short wavelength corona energy through lenses system 15 onto image intensifier 20 which converts the corona energy to a digital corona image 25. Visible path lenses 30 focuses visible light onto common CCD or CMOS image sensor 35 which converts visible light to digital visible image 37. Image combiner 40 combines corona image 25 and visible image 37 and sends the resulting composite image 43 to display 45.

Figure 3:
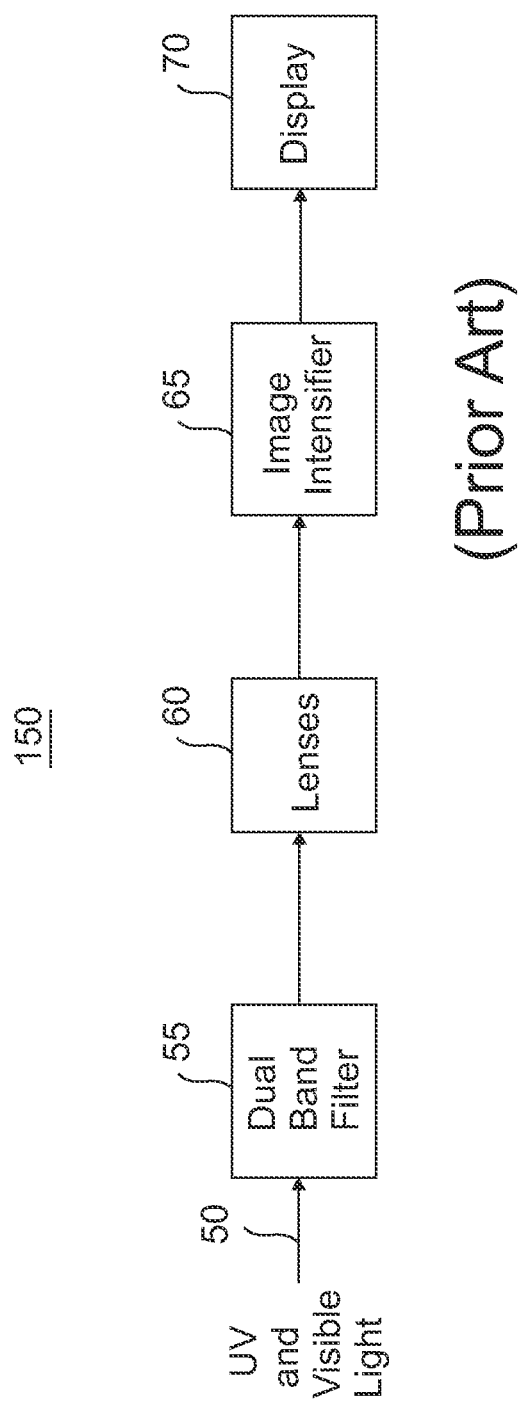
FIG. 3 illustrates an alternate functional block diagram of a prior art solar blind corona camera.

A functional block diagram of an alternative solar blind UV camera 150 is illustrated in FIG. 3. UV and visible light 50 is filtered using dual-band optical filter 55 and focused onto image intensifier 65 using lenses system 60. The composite image from image intensifier 65 is displayed on display 70. However, this approach is simply not practical unless variable density or variable bandwidth dual filters are implemented. This is because the intensity of sunlight varies over many magnitudes between night, dawn, dusk, cloudy day, and bright noontime overhead sun. Selecting a fixed filter optimized for one of these lighting conditions would not be satisfactory in other lighting conditions.

Figure 4:
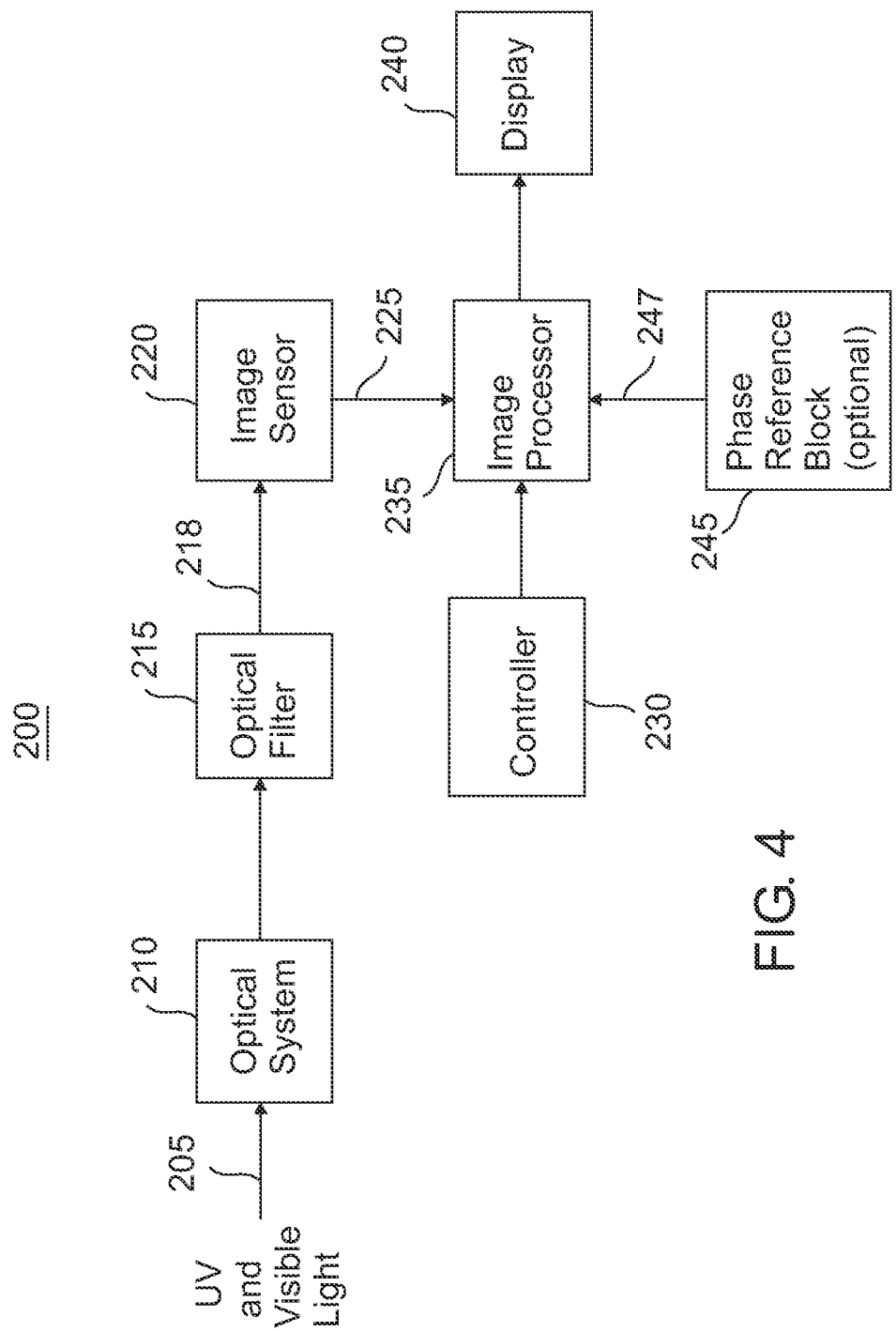
FIG. 4 illustrates a functional block diagram of the present invention AC discharge solar blind corona camera.

In contrast to this prior art, a functional block diagram of the present invention AC discharge corona camera 200 is illustrated in FIG. 4. UV and visible light 205 is received and focused using optical system 210. Optical filter 215 removes a portion of incoming UV and visible light 205 leaving filtered light 218. When corona is being observed, filtered light 218 is composed of discharge corona light and ambient light (background scene light). Filtered light 218 is converted to a digital image using image sensor 220. Multiple digital images 225 are processed using image processor 235 and displayed on display 240. Controller 230 allows the user to select and adjust various operating parameters such as zoom, displayed intensity, etc. Optional phase reference block 245 provides a reference phase 247 for the AC power system being observed as will be explained later.

Figure 5:
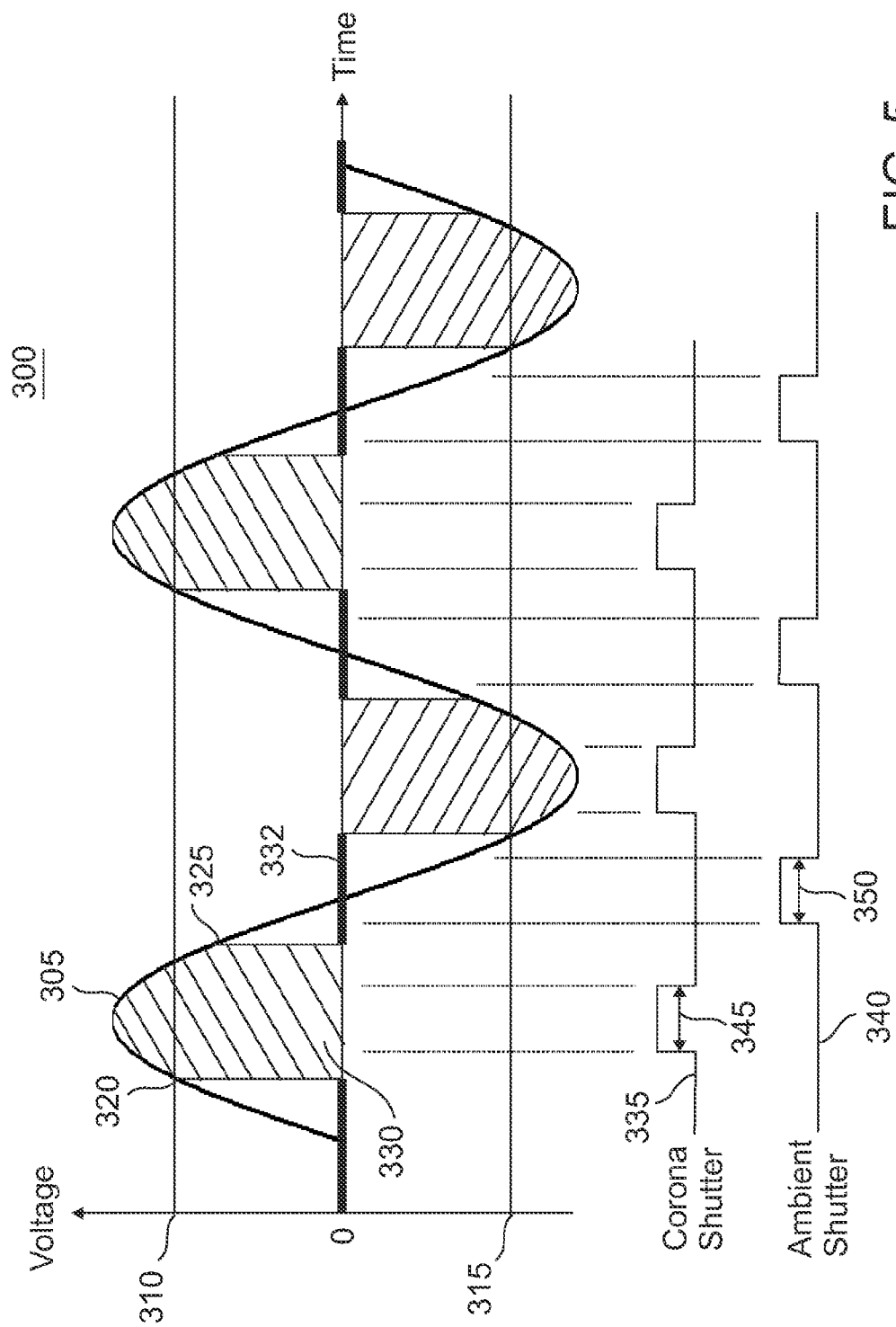
FIG. 5 illustrates the principal of operation of the present invention AC discharge corona camera.

The principal of operation of the present invention discharge corona camera 200 is illustrated in diagram 300 of FIG. 5. AC power sinusoidal voltage waveform 305 exceeds the positive and negative electrical discharge voltage thresholds 310 and 315 respectively each AC waveform cycle. Discharge corona period 330 occurs between initiation point 320 and extinction point 325 as indicated by the shaded region. Generally, positive and negative thresholds 310 and 315 respectively are equal. However, initiation point 320 is generally higher than extinction point 325 because once an electrical partial discharge is started, it can continue until the voltage drops well below the initiation point 320. Ambient period 332 occurs between corona periods 330.

Although any appropriate image sensor 220 in FIG. 4 can be implemented, the preferred image sensor 220 is a global shutter UV sensitive CCD or CMOS image sensor. Common monochrome CCD and CMOS camera image sensors are typically optimized for UV radiation by removing sensor chip micro-lenses and replacing its optical glass window or coating with a quartz window or coating transparent to UV.

A global shutter refers to how the image sensor captures each frame. Historically, a CCD (Charge-Coupled Device) image sensor used a global shutter while a CMOS (Complementary Metal-Oxide-Semiconductor) image sensor used a rolling shutter. Currently, both CCD and CMOS image sensors are available in global shutter. With a global shutter, the entire image frame is captured at the exact same time (like normal camera film). With a rolling shutter, the image frame is exposed from top to bottom (like a TV frame).

Although there are many tradeoffs in selecting either a CCD or CMOS image sensor, they all basically operate as explained below using an electronic shutter (exposure time), readout, and reset timing pulses. During the electronic shutter pulse period, the image sensor linearly integrates charge proportional to the intensity of light striking it over its exposure period. At the end of the shutter period, the accumulated charge in each pixel is read out which represents the image frame. The image sensor is then reset which zeros out the accumulated pixel charge and the sensor is ready for the next electronic shutter pulse.

In FIG. 5, corona shutter 335 and ambient shutter 340 are illustrated separately for clarity whereas in reality they are both combined into a single image sensor electronic shutter timing pulse. The image sensor exposure time is equal to the duration of the shutter pulse. Corona shutter 335 is timed to occur during discharge corona period 330 and its duration 345 is ideally equal to that of corona period 330. Ambient shutter 340 is timed to occur during ambient period 332 and its duration 350 is ideally equal to that of corona period 330. When corona shutter duration 345 and ambient shutter duration 350 are equal, the exposure accumulated pixel charges due to ambient light in both the corona and ambient periods are equal. Therefore, when the ambient period accumulated pixel charges are subtracted from the corona period accumulated pixel charges, the resultant pixel charges equals the accumulated pixel charges due to corona-only light.

Figure 6:
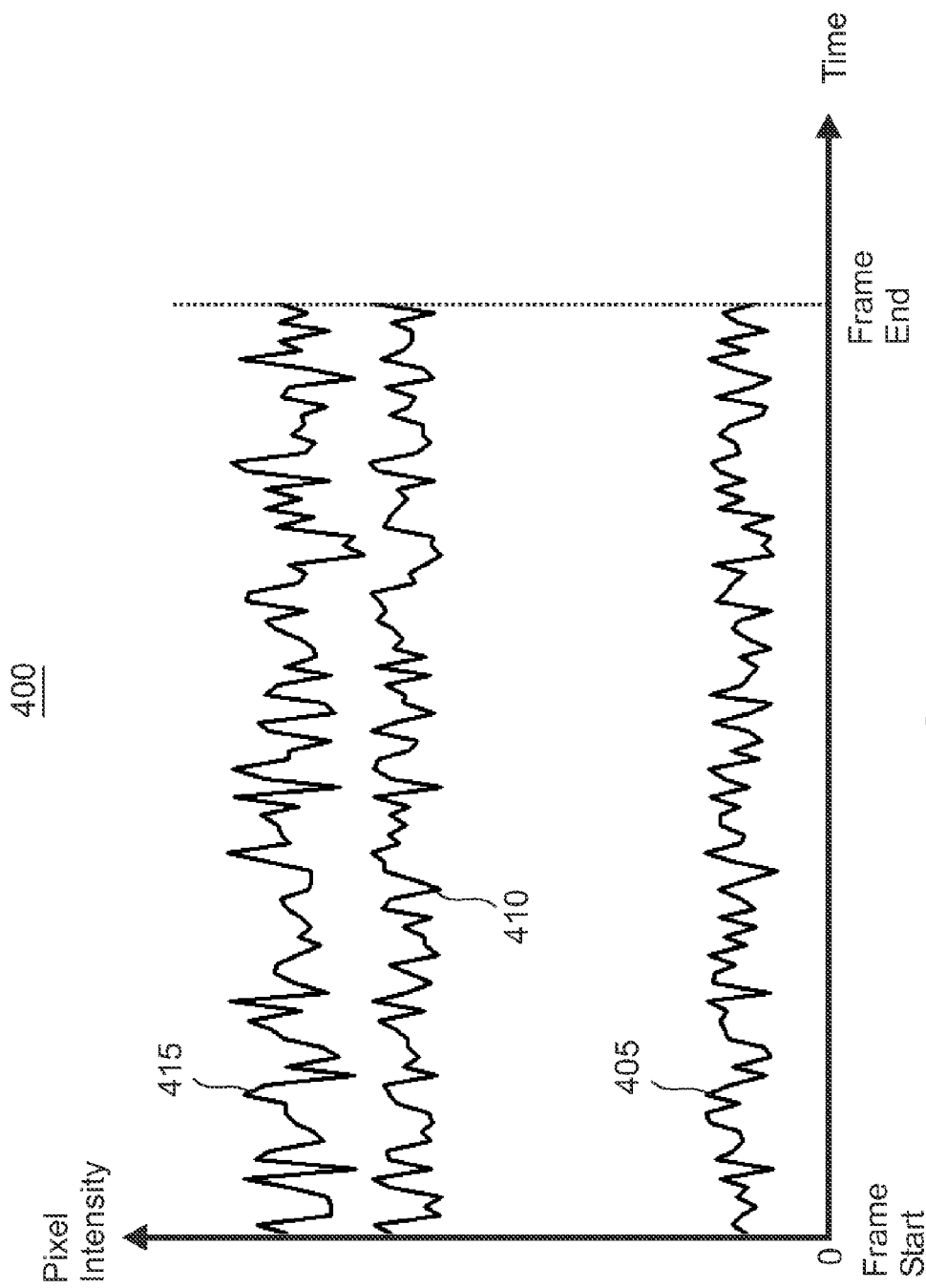
FIG. 6 illustrates pixel intensity readout versus time for corona-plus-ambient image, ambient image, and corona-only images.

These accumulated pixel charges are illustrated in pixel intensity readout graph 400 in FIG. 6 which presents the readout versus time of the accumulated pixel charge (pixel intensity) for the entire image. In a totally dark environment, corona-only image 405 (corona-only pixel intensity accumulated during corona shutter duration 345) may be quite small. In daylight, the ambient image 410 accumulated during the ambient shutter duration 350 may be quite large. In daylight, the corona-plus-ambient image 415 accumulated during the corona shutter duration 345 is equal to the linear sum of corona-only image 405 and ambient image 410. Therefore, when daylight ambient image 410 is subtracted from daylight corona-plus-ambient image 415, the resultant image is the equivalent dark environment corona-only image 405.

The corona and ambient shutter durations 345 and 350 respectively are selected based on ambient light intensity. In a dark environment, these durations can equal corona period 330. However, in bright daylight, these durations (image sensor exposure time) may need to be reduced either automatically via image processor 235 or manually via controller 230 illustrated in FIG. 4 to prevent image sensor saturation. If the image sensor saturates, the accumulated pixel charge intensity (corona-plus-ambient image 415) during the corona shutter duration 345 is no longer equal to the linear sum of the accumulated pixel charges (corona-only image 405 and ambient image 410) and the equivalent dark environment corona period intensity (corona-only image 405) cannot be determined by subtraction. Either specific manual duration or automatic duration can be selected as directed by an operator control setting command.

The invention of subtracting ambient period intensity (ambient image 410) from corona period intensity (corona-plus-ambient image 415) effectively makes the AC discharge corona camera of the present invention solar blind.

FIG. 5 illustrates exposing and processing every corona period 330. Although this is possible using high speed image sensors, there may not be sufficient time between shutter periods to readout the image when slower image sensors are used. The solution is simply to eliminate one or more corona and ambient shutter durations 345 and 350 respectively (not expose and process every corona and ambient period). For example, process the first corona period 330 in the first AC cycle 305, then process the center ambient period in the second AC cycle 305, then process the first corona period 330 in the third AC cycle 305, and so on.

Figure 7:
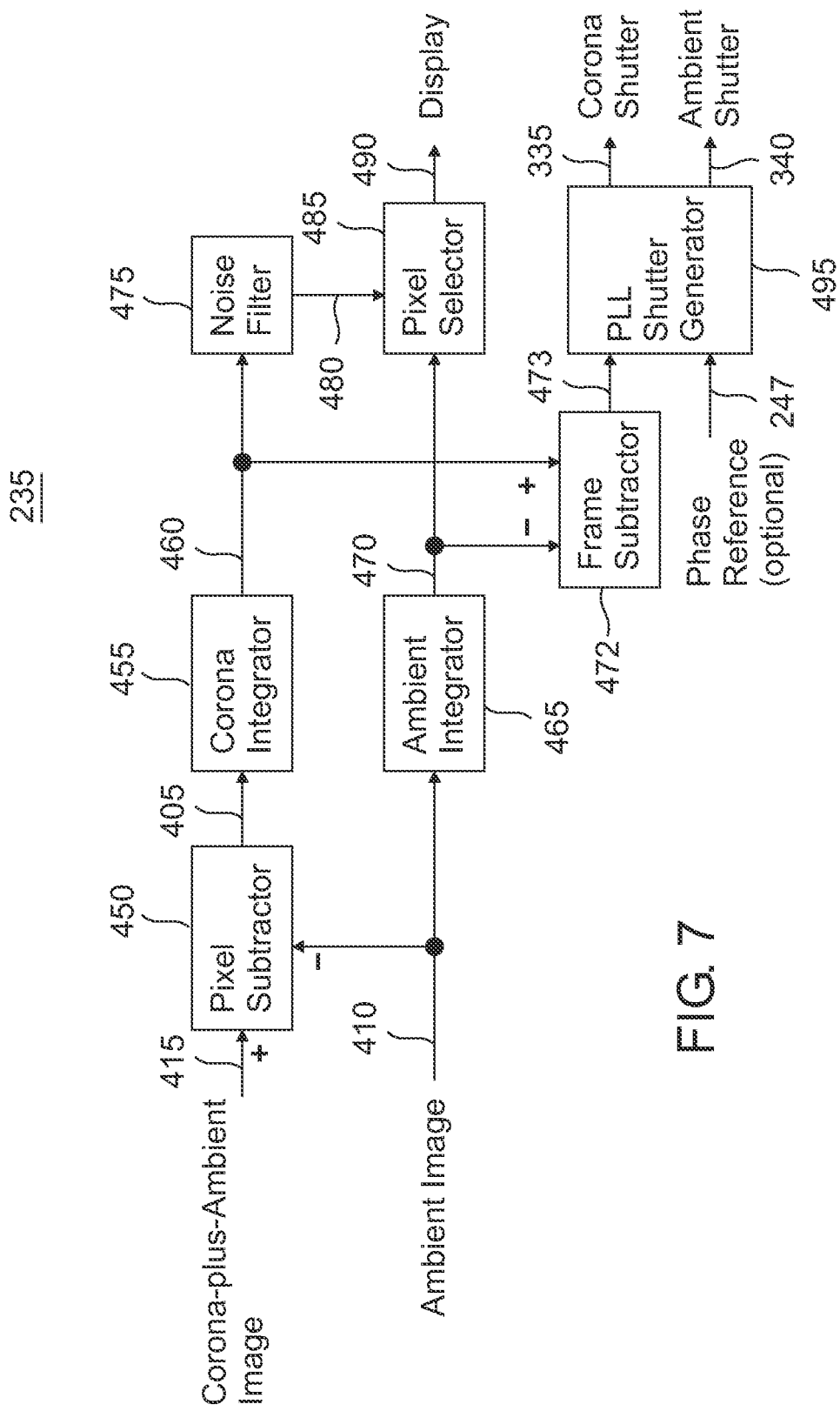
FIG. 7 illustrates a functional block diagram of image sensor processing.

A functional block diagram of image processor 235 in FIG. 4 is illustrated in FIG. 7. Corona-plus-ambient image 415 and ambient image 410 are illustrated separately for clarity whereas in reality there is only a single image sensor intensity readout port.

Ambient image 410 is subtracted from corona-plus-ambient image 415 in pixel subtractor 450 to produce equivalent solar blind corona-only image 405. This intensity is integrated over one or more corona periods 330 using corona integrator 455 to produce corona frame 460. Likewise, ambient image 410 is also integrated over one or more ambient periods 332 between corona periods 330 using ambient integrator 465 to produce monochrome ambient frame 470.

Figure 8:
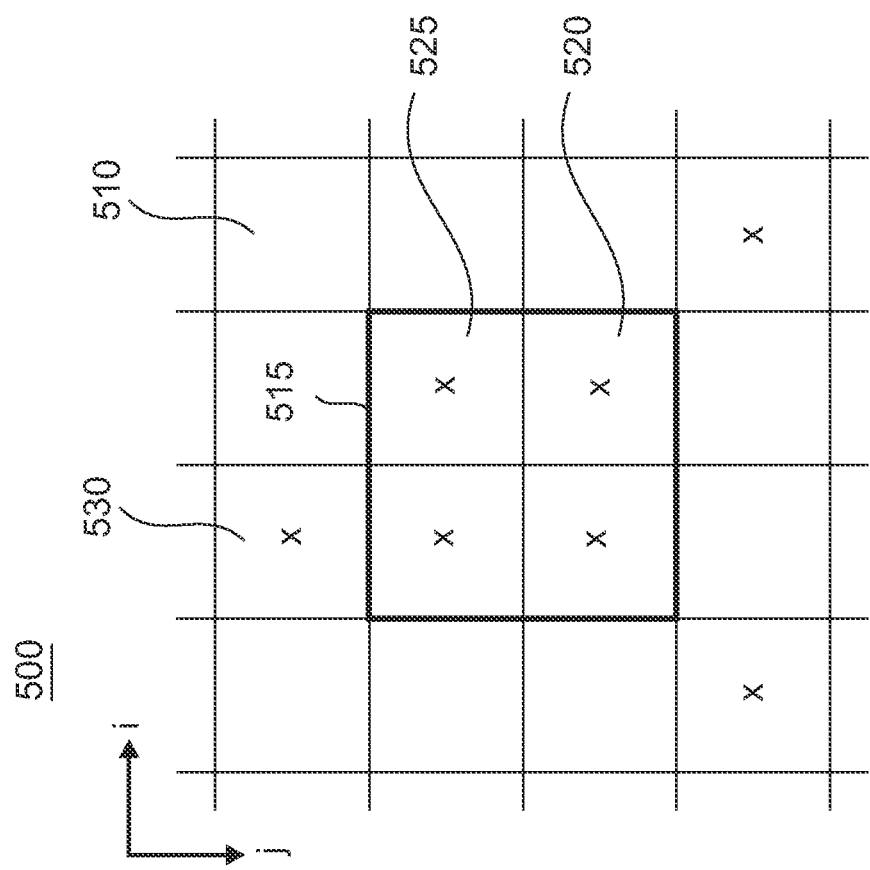
FIG. 8 illustrates a m-out-of-n pixel block noise filter.

Corona frame 460 can be noise filtered, annunciated, and intensified in noise filter 475. One example of a noise filter is illustrated in FIG. 8 which shows part of corona frame 460. This noise filter consists of simple m-out-of-n block filter whose purpose is to remove pixels whose intensity are below a threshold level and to remove scattered noise pixels. This results in a cleaner displayed corona frame.

Assume corona frame 460 is read out from left to right and top to bottom. A portion of this frame 500 composed of pixels 510 is illustrated in which pixels whose intensity exceeds a particular threshold is indicated by an X. Also assume for each pixel(i,j) filtered, the intensity of pixel (i,j), (i−1,j), (i,j−1), and (i−1,j−1) are examined as illustrated by block 515. Using 4-out-of-4 block filtering, pixel 520 would pass through the filter along with all the pixels in block 515 because all 4 pixels exceed the intensity threshold. All other pixels in this example would be set to zero.

If using 3-out-of-4 filtering, then the additional pixel 530 would pass when filtering pixel 525 because only 3 pixels in a block formed around pixel 525 are required to display all pixels in the block that exceed the intensity threshold. Multiple different size block filters and intensity thresholds can be implemented for noise filter 475 and selected based on current viewing conditions to optimize corona detection.

When using a shortpass optical filter with a stopband on the order of 400 nm prior to the image sensor, most corona energy is passed and enough ambient solar spectral energy to view the background or ambient light scene. The ambient scene is captured in UV light and not visual color light so the ambient scene will be displayed as a monochrome black & white grayscale image and not as a color image.

In addition to block filtering, noise filter 475 can also annunciate corona pixels to differentiate them from monochrome ambient pixels by coloring them, intensifying them, blinking them, or etc. as directed by an operator control setting command. The output of noise filter 475 is filtered corona frame 480.

Non-zero pixels in filtered corona frame 480 replaces corresponding pixels in ambient frame 470 using pixel selector 485. Display frame 490 then consists of monochrome ambient frame 470 overlaid with color and intensity annunciated filtered corona frame 480.

Figure 9:
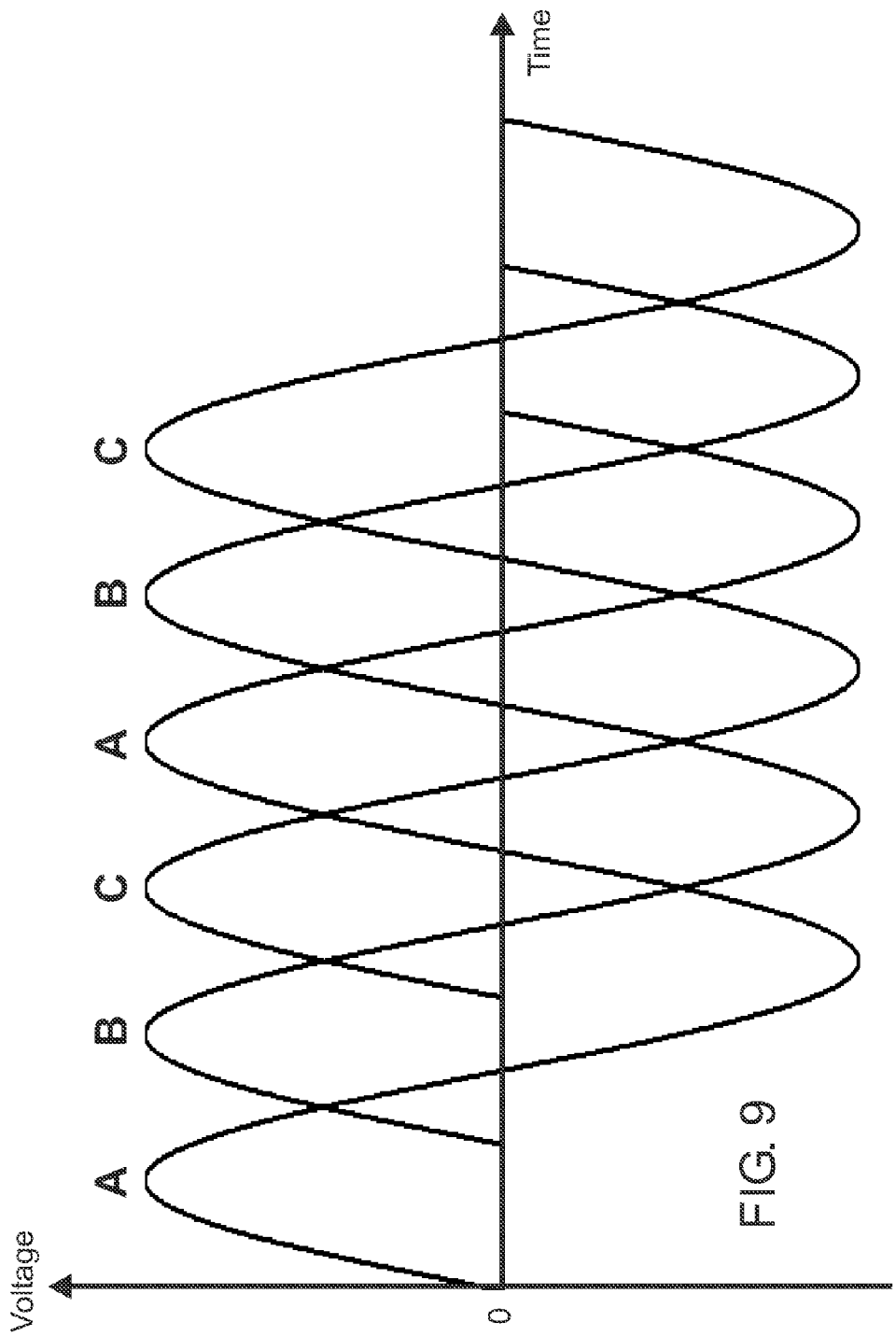
FIG. 9 illustrates the waveform and phase relationships in AC three-phase power systems.

The instantaneous phases of the three conductors in a three-phase AC power system are separated by 120 degrees as illustrated in FIG. 9. A phase attribute of A, B, or C is typically assigned to each of the three conductor phases to identify them. The initial assignment of phase attribute to each of the three conductors typically takes place at a transmission or distribution substation and this assignment is somewhat arbitrary. The attributes assigned at the substations become known as the tagging reference phases for that substation because the goal is to consistently tag, mark, or identify each conductor with its proper phase attribute throughout the substation's distribution region.

AC power sinusoidal voltage waveform 305 in FIG. 5 represents one of the three phases illustrated in FIG. 9.

Although not required, optional phase reference block 245 in FIG. 4 can be implemented to expedite synchronizing corona shutter 335 timing with corona period 330. Commonly owned U.S. Pat. No. 8,533,121 issued Sep. 10, 2013 describes a base server at a reference location which communicates AC power phase via the Internet to a field client at a field location so that phase can be identified at the field location. Basically, this system uses GPS timing to compare the instantaneous phase at both locations. Since phase at the reference location is known, the phase at the field location can be determined.

Phase reference block 245 implements the field client portion of this system which consists of a GPS receiver and either a PC or smartphone. U.S. Pat. No. 8,533,121 and its references completely describes the technique which is now a common industry method of real-time phase identification. In many utilities, most candidate conductors for discharge corona inspection have already been phase identified.

A side benefit of implementing phase reference block 245 is that the phase attribute of the corona can be determined if it is not already known, which represents another technique for phase identifying a conductor.

For long range or fixed security camera like observations that are explained later, where the present invention discharge corona camera 200 is plugged into utility AC power, phase reference block 245 can simply generate a phase reference from the camera AC power cord.

Without phase reference block 245, a longer corona observation time is required to synchronize corona shutter 335 with corona period 330 of the AC power sinusoidal voltage waveform 305 being observed.

AC power systems are locked into large grids so their frequency is very stable and only slowly varies on the order of 0.1 Hz over time. If reference block 245 is not used, the output of corona frame 460 and ambient frame 470 in FIG. 7 are compared in frame subtractor 472 as the frequency of corona shutter 335 and ambient shutter 340 are slowly varied. Frame subtractor 472 output is frame difference 473. If no difference is found, it indicates no corona is present because the intensity of the two integrated images will be identical. However, if a differential peak is obtained as shutter timing is varied, it, indicates that corona shutter 335 and ambient shutter 340 are synchronized with corona period 330 and ambient period 332 respectively. Once locked, corona period 330 and ambient period 332 are tracked as the frequency of AC power sinusoidal voltage waveform 305 continuously slowly varies. Phase lock loop (PLL) shutter generator 495 uses frame difference 473 to perform synchronization and tracking.

In contrast, with phase reference block 245, both the initial setting and tracking of corona shutter 335 and ambient shutter 340 are already known if the phase of the conductor being observed for discharge corona is known. Reference phase 247 from phase reference block 245 can be used by PLL shutter generator 495 to rapidly adjust corona'shutter 335 and ambient shutter 340 timing to synchronize and track corona period 330 and ambient period 332 based on known conductor phase and phase reference 247.

Image processor 235 can be implemented using all digital techniques. Acquiring and tracking corona period 330 and ambient period 332 can be implemented using standard digital PLL techniques that are well known to those skilled in the art. Common design parameters such as loop order, loop bandwidth, acquisition range, transient response, etc. can all be selected (and varied depending on ambient light conditions if required) to achieve rapid acquisition.

Figure 10:
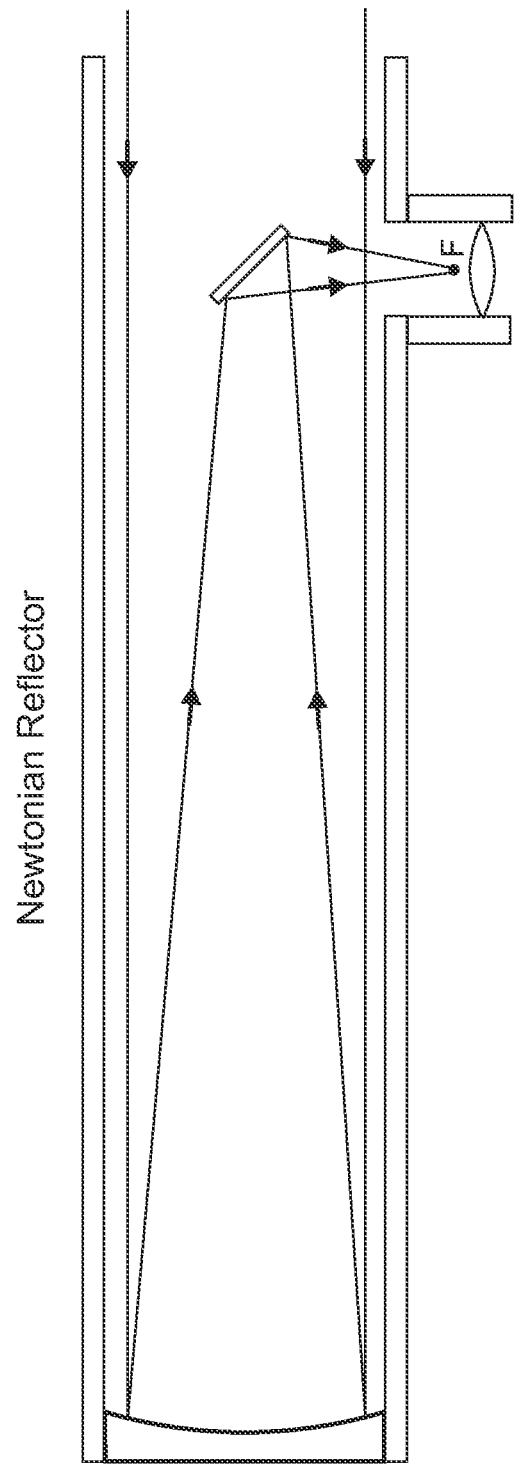
FIG. 10 illustrates a Newtonian reflector.
Figure 11:
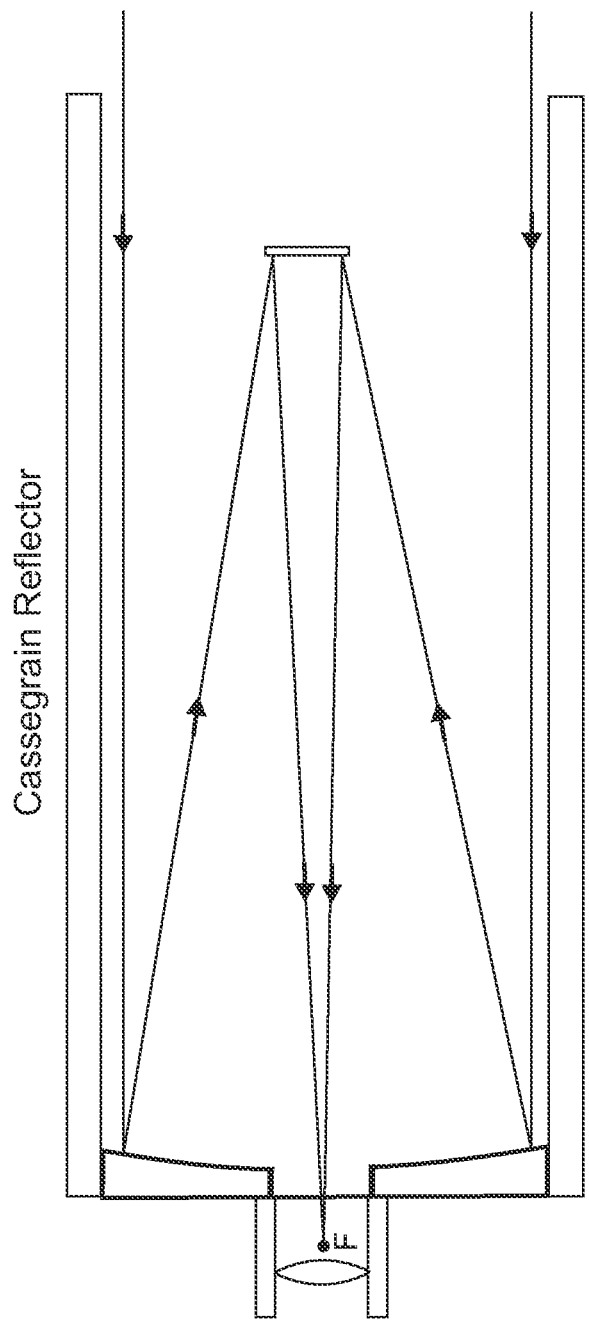
FIG. 11 illustrates a Cassegrain reflector.

Optical system 210 in FIG. 4 can be implemented using refractors (lenses) or reflectors (mirrors). Normal camera lenses are nearly opaque to UV unless quartz glass is used. UV camera lenses are very expensive, costing many thousands of dollars. In contrast, mirrors reflect UV as well as visible light, come in large apertures, are very inexpensive, and only cost a few hundred dollars. The most appropriate reflectors for this application are Newtonian reflectors (FIG. 10) and Cassegrain reflectors (FIG. 11) where the image sensor replaces the eyepiece.

Figure 12:
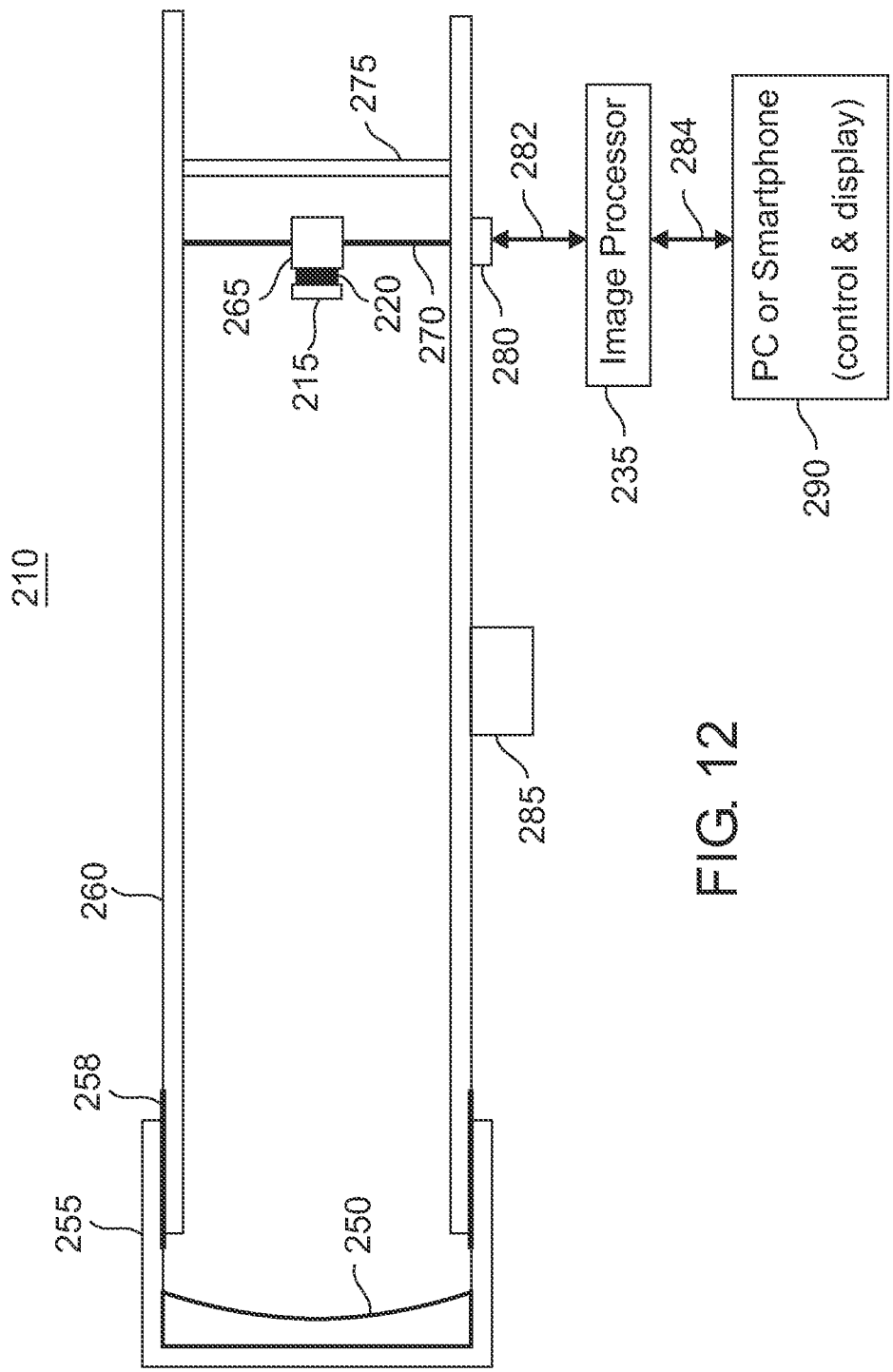
FIG. 12 illustrates a low cost implementation of present invention AC discharge solar blind corona camera using a modified Newtonian reflector.

A modified Newtonian reflector 210, illustrated in FIG. 12, provides one of the lowest cost implementations for present invention AC discharge corona camera 200. Primary mirror 250 is mounted in mirror holder 255 which screws onto tube 260 using threads 258 to provide manual focus. UV and visible light enters window 275 which is recessed in tube 260 for sun shading. Light reflected by primary mirror 250 passes through optical filter 215 and focuses onto image sensor 220 which is placed at the image plane of primary mirror 250. The image plane is located at the distance from primary mirror 250 at which a distant object comes into focus on image sensor 220. Optical filter 215 and image sensor 220 are mounted on image sensor holder 265 which is rigidly held in place using thin supports 270 (thin to minimize primary mirror 250 light obstruction) which are attached to tube 260. Electrical connector 280 and electrical cable 282 connects image sensor 220 to image processor 235. Image processor 235 connects to PC or smartphone 290 either by wireless or wired connection 284. PC or smartphone 290 is used both to display images and control camera parameters such as zoom, intensity, contrast, etc. Mount 285 attaches tube 260 to either a tripod or a rigid structure.

Instead of implementing manual focus on the modified Newtonian reflector illustrated in FIG. 12, electronic manual focus or autofocus can be implemented by moving the horizontal position of image sensor 220, using a small motor mounted to image sensor holder 265, instead of moving the horizontal position of primary mirror 250 by manually turning mirror holder 255. Electronic manual or autofocus can be implemented using control commands from PC or smartphone 290.

As taught by basic communication theory, information communicated is proportional to the information cube volume, which for corona cameras, is equal to UV power multiplied by image sensor sensitivity multiplied by image integration time. That is, the same information can be communicated as each of these three parameters are varied as long as the information cube volume remains the same. The information communicated is the discharge corona UV image.

For current corona cameras, UV power is very small because solar blind filters remove most of corona UV energy and expensive small aperture lenses are used. Image integration time is also small because the cameras are designed for real-time handheld imaging and use integration times on the order of 33 milliseconds (30 Hz frame rate). However, image sensor sensitivity is extremely high because image intensifiers are used which multiply incoming photons by two or three orders of magnitude.

For present invention AC discharge corona camera 200, image sensor sensitivity is much lower if CCD or CMOS image sensors are used instead of image intensifiers. However, UV power is much larger because very little of the corona UV energy is filtered out, when solar blind-filters are not implemented, and low cost large aperture reflectors can be used which collect and concentrate more corona UV light onto the image sensor. Image integration time is also much longer as it can be on the order of a few seconds when AC discharge corona camera 200 is stationary.

AC discharge corona camera 200 illustrated in FIG. 4 provides a simple common architecture that achieves all three objectives stated in the background section of this patent application. Namely, low cost, long range, and fixed security camera like observation. However, the particular implementation of the optical system, image sensor, or other functional blocks in FIG. 4 can vary depending on which objective is selected as illustrated in the examples below.

To directly replace current corona cameras being used on AC power systems, a lenses optical system, an image intensifier, an internal display, and no phase reference could be implemented. A shortpass optical filter with a cutoff around 325 nm might be implemented as a good compromise between corona energy and ambient background scene energy. Due to the high image intensifier gain, corona-only image 405 and ambient image 410 in FIG. 7 could be displayed directly without additional integration and filtering by setting corona and, ambient integrators 455 and 465 respectively to one (pass through corona-only image 405 and ambient image 410 without integration). These selections would then allow a 30 HZ frame rate for handheld viewing. However, the ambient scene image would be monochrome (not color as in some current corona cameras).

For a low cost substitute for current corona cameras used on AC power systems, the modified Newtonian reflector illustrated in FIG. 12 with either a 3 inch or 4 inch diameter primary mirror and CCD or CMOS image sensor could be implemented. An UV shortpass filter whose cut-off wavelength is between 300 nm and 400 nm could be implemented. For example, a cut-off wavelength of 375 nm would allow all wavelengths below 375 nm to pass while blocking all wavelengths above 375 nm. Phase reference could be implemented as part of image processor 235 and PC or smartphone 290.

Alternatively, a standard Newtonian reflector (FIG. 10) or Cassegrain reflector (FIG. 11) could be implemented where a complete custom or standard UV vision system camera replaces the eyepiece. Although not as optimum as a custom solution, lenses-less programmable UV vision system cameras with standard hardware and software interfaces are available which could be programmed to operate as described in this patent application.

Currently, corona surveys require an operator to physically approach and check each electrical component using a current handheld corona camera. This is a very expensive and time consuming process with long time delays between repeated surveys. The present invention AC discharge corona camera 200 allows many surveys to be automated and continually repeated so as to find new corona incidents quickly, by implementing a long range version or a security camera version of this corona camera.

Figure 13:
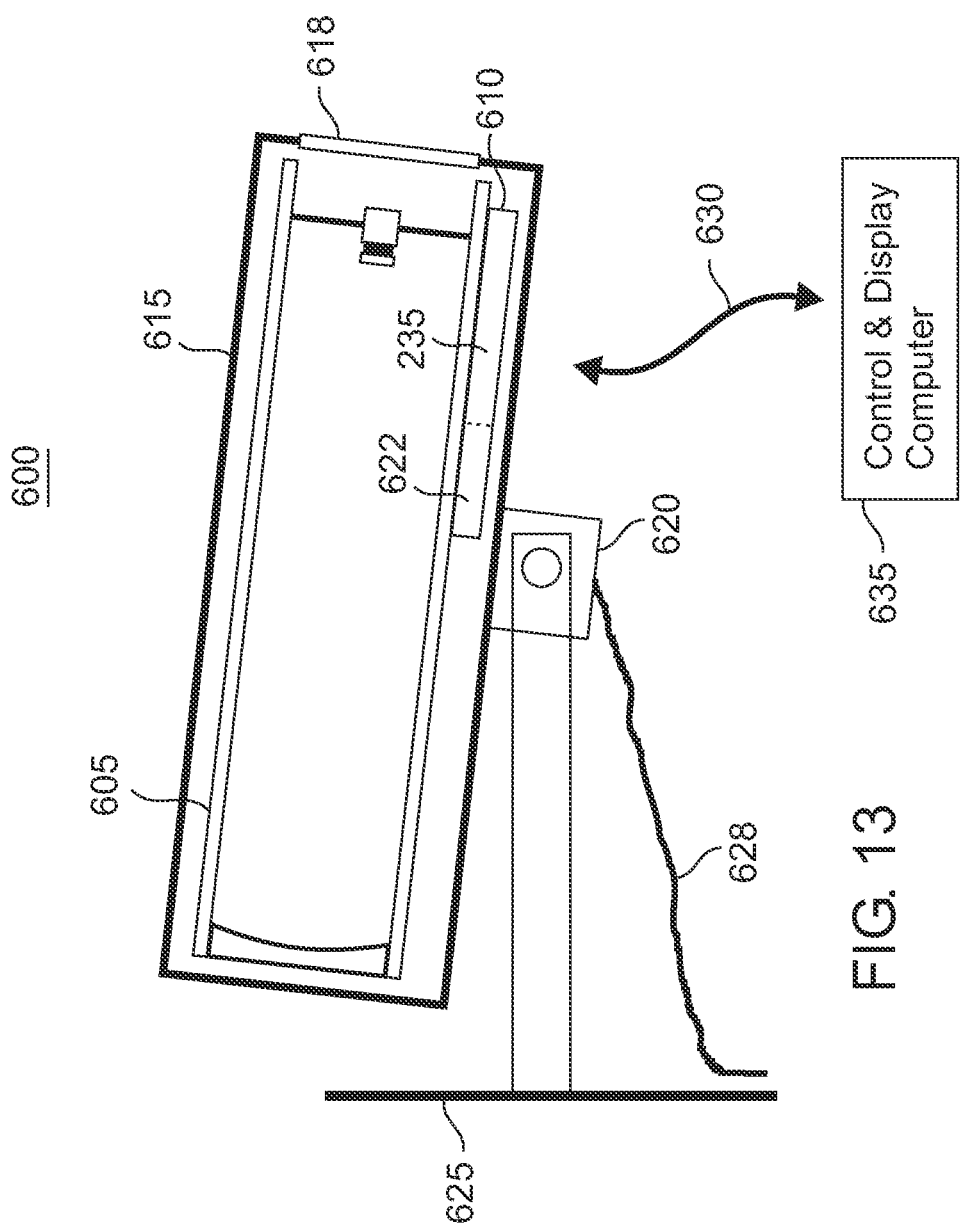
FIG. 13 illustrates an automated corona survey system.

Automated corona survey system 600 is illustrated in FIG. 13. UV survey camera 605 is placed in weatherproof enclosure 615 with window 618, mounted on pan and tilt unit 620, and attached to rigid structure 625. UV survey camera 605 can be implemented as modified Newtonian reflector 210 illustrated in FIG. 12 with autofocus implemented using a small motor mounted to image sensor holder 265 as described earlier. Camera processor 610 inside UV survey camera 605 is composed of image processor 235 and communications interface 622. Camera processor 610 performs the same functions as image processor 235 in FIG. 4 except camera processor 610 also includes communications interface 622 to control & display computer 635 over wired or wireless communication link 630. Power cable 628 supplies power to UV survey camera 605, pan and tilt unit 620, and provides phase reference 247 to PLL shutter generator 495 as illustrated in FIG. 7. Since power cable 628 is connected to substation power, it provides a phase reference for AC power sinusoidal voltage waveform 305 illustrated in FIG. 5 and thus for substation AC discharge corona period 330.

Pan, tilt, and focus is preset into computer 635 for each corona prone item to be inspected and computer 635 programmed to automatically scan to each item and inspect for discharge corona. Optimally, scans would continuously take place during nighttime to avoid high levels of solar UV.

One or multiple UV survey cameras 605 could be mounted in a transmission or distribution substation at locations optimized to view most or all potential discharge corona prone items in the substation. Discharge corona could be automatically detected by comparing image processor corona frames 460 with ambient frames 470 illustrated in FIG. 7. Suspect frames could be sent to control & display computer 635 for further scrutiny (similar to motion detection in security cameras). Control & display computer 635 could either be placed at the substation or some central utility location that would service multiple substations. Alternatively, an unattended control & display computer 635 at each substation could be checked periodically for discharge corona detections.

The range of current solar blind corona cameras is limited because the UV solar blind portion of the spectrum is highly attenuated by the atmosphere (and thus solar blind). In contrast, range of present invention AC discharge corona camera 200 is essentially unlimited when a 400 nm shortpass filter is used because this longer wavelength portion of the spectrum is not attenuated by the atmosphere (and thus not solar blind).

Automated corona survey system 600 could be implemented using a large aperture Cassegrain reflector (8" to 14"), situating it at a high observation location, and sequentially pointing it at each electrical item to be checked. Optimally, scans would continuously take place during nighttime to avoid high levels of solar UV. Using currently available astronomy telescope computerized mounts, this automated corona survey system could check every item daily looking for new corona.

Although the preferred embodiments of the invention have been illustrated and described in detail, it will be readily apparent to those skilled in the art that various modifications may be made therein without departing from the spirit of the invention or from the scope of the appended claims.

For example, optical filter 215 in FIG. 4 could be placed prior to optical system 210 and used in place of optical window 275 in FIG. 12.

The present invention AC discharge corona camera 200 could also be implemented using an image intensifier, mounted on a stabilized helicopter or other vehicle platform, and used to survey long sections of transmission and distribution lines.

What is claimed is:

1. A method for detecting AC power system high voltage discharge corona, said method comprising:

providing an optical system, optical filter, and image sensor;

generating a corona shutter, said corona shutter timed to occur during said discharge corona periods of said AC power system voltage waveform;

generating an ambient shutter, said ambient shutter timed to occur between said discharge corona periods of said AC power system voltage waveform;

receiving UV and visible light from said AC power system high voltage discharge corona using said optical system;

removing a portion of said UV and visible light using said optical filter leaving filtered light, said filtered light composed of corona light and ambient light;

focusing said filtered light onto said image sensor;

converting said filtered light to corona-plus-ambient image by triggering said image sensor with said corona shutter;

converting said filtered light to ambient image by triggering said image sensor with said ambient shutter;

converting said corona-plus-ambient image to corona-only image by subtracting said ambient image from said corona-plus-ambient image;

generating a corona frame by integrating one or more said corona-only image;

generating an ambient frame by integrating one or more said ambient image; and displaying said ambient frame overlaid with said corona frame.

2. A method as claimed in claim 1 wherein said generating said corona shutter and said ambient shutter comprises:

generating a frame difference by subtracting said ambient frame from said corona frame; and timing said corona shutter to occur during said discharge corona periods and said ambient shutter to occur between said discharge corona periods by monitoring said frame difference as said corona shutter frequency is varied.

3. A method as claimed in claim 2 wherein said timing is provided by a PLL, said PLL input is said frame difference and said PPL output is said corona shutter and said ambient shutter.

4. A method as claimed in claim 1 wherein said generating said corona shutter and said ambient shutter comprises:

identifying conductor phase being inspected for said discharge corona;

obtaining a phase reference for said conductor; and synchronizing said corona shutter and said ambient shutter timing to said AC power system high voltage discharge corona using said conductor phase and said phase reference.

5. A method as claimed in claim 1 additionally comprising:

receiving a setting command from an operator;

manually adjusting said corona shutter duration and said ambient shutter duration to a specific duration, said specific duration commanded by said setting command; and automatically adjusting said corona shutter duration and said ambient shutter duration when commanded by said setting command.

6. A method as claimed in claim 1 additionally comprising filtering and annunciating said corona frame.

7. A method as claimed in claim 6 wherein said filtering comprises:

selecting a said corona frame pixel intensity threshold;

forming a pixel block around each said corona frame pixel, said pixel block containing n pixels;

determining if said corona frame pixels in said pixel block exceed said intensity threshold; and setting all corona frame pixels in said pixel block to zero intensity if less than m said corona frame pixels in said pixel block exceed said intensity threshold.

8. A method as claimed in claim 6 wherein said annunciating comprises:

receiving a setting command from an operator;

coloring said corona frame using a specific color, said specific color commanded by said setting command;

intensifying said corona frame using a specific intensity, said specific intensity commanded by said setting command; and blinking said corona frame when commanded by said setting command.

9. A method as claimed in claim 1 wherein said optical system is selected from the group consisting of: Newtonian reflectors and Cassegrain reflectors.

10. A method as claimed in claim 1 wherein said image sensor is selected from the group consisting of: UV sensitive CCD image sensors, global shutter UV sensitive CCD image sensors, UV sensitive CMOS image sensors, and global shutter UV sensitive CMOS image sensors.

11. A method as claimed in claim 1 wherein said optical filter is an UV shortpass filter whose cut-off wavelength is between 300 nm and 400 nm.

12. A method as claimed in claim 1 additionally comprising:

pointing a Newtonian reflector at said discharge corona;

mounting said image sensor on an image sensor holder;

mounting said optical filter in front of said image sensor;

mounting said image sensor holder inside said Newtonian reflector, said mounting selected to place said image sensor at said Newtonian reflector primary mirror image plane; and focusing light from said discharge corona onto said image sensor by adjusting distance between said Newtonian reflector primary mirror and said image sensor.

13. A method as claimed in claim 12 additionally comprising:

mounting a motor on said image sensor holder, said motor configured to adjust said distance of said image sensor from said Newtonian reflector primary mirror;

receiving a setting command from an operator;

manually adjusting said distance of said image sensor from said Newtonian reflector primary mirror, said distance commanded by said setting command; and autofocusing said distance of said image sensor from said Newtonian reflector primary mirror when commanded by said setting command.

14. A corona camera for detecting AC power system high voltage discharge corona, said corona camera comprises:

an optical system configured to receive UV and visible light from said discharge corona;

an optical filter configured to remove a portion of said UV and visible light leaving filtered light, said filtered light composed of corona light and ambient light;

an image processor, said image processor configured to provide a corona shutter during one or more said discharge corona periods and an ambient shutter between one or more said discharge corona periods;

an image sensor, said image sensor configured to capture a corona-plus-ambient image when triggered by said corona shutter and an ambient image when triggered by said ambient shutter;

an image subtractor configured to generate a corona-only image by subtracting said ambient image from said corona-plus-ambient image;

a corona integrator configured to generate a corona frame by integrating one or more said corona-only image;

an ambient integrator configured to generate an ambient frame by integrating one or more said ambient image;

a pixel selector configured to produce a display image by replacing said ambient frame pixels with said corona frame pixels; and a display configured to display said display image.

15. A corona camera as in claim 14 wherein said corona camera further comprises a noise filter, said noise filter configured to remove said corona frame pixels whose intensity is below a threshold intensity, remove said corona frame pixels that are scattered, and to annunciate remaining said corona frame pixels.

16. A corona camera as in claim 14 wherein said corona camera further comprises:
- a frame subtractor, said frame subtractor configured to generate a frame difference by subtracting said ambient frame from said corona frame; and
- a PLL, said PLL configured to synchronize said corona shutter to said discharge corona periods and said ambient shutter to periods between said discharge corona periods using said frame difference.

17. A corona camera as in claim 14 wherein said optical system comprises:
- a Newtonian reflector, said Newtonian reflector configured to mount on a stationary support and point said Newtonian reflector at said discharge corona;
- a mirror holder, said mirror holder configured to hold said Newtonian reflector primary mirror and provide manual focus by screwing onto said Newtonian reflector tube;
- an image sensor holder, said image sensor holder configured to place said image sensor inside said Newtonian reflector tube at said Newtonian reflector primary mirror image plane; and
- an electrical connector, said electrical connector configured to connect said image sensor to said image sensor processor.

18. An automated corona survey system for detecting AC power system high voltage discharge corona, said corona survey system comprises:
- a UV survey camera, said UV survey camera configured to detect ambient light and said discharge corona;
- a weatherproof enclosure, said enclosure configured to hold said UV survey camera and a camera processor;
- a pan-and-tilt unit, said pan-and-tilt unit configured to be mounted on a rigid structure and point said enclosure in any direction;
- an AC power cable, said AC power cable configured to power said UV survey camera, said pan-and-tilt unit, and provide a phase reference to said camera processor;
- a computer at a central location, said computer configured to control said UV survey camera, said camera processor, and said pan-and-tilt unit;
- a communications link, said communications link configured for said UV survey camera and said camera processor to communicate with said computer; and
- a computer software program, said program configured to send pan-and-tilt settings to said pan-and-tilt unit, send focus settings to said UV survey camera, automatically detect corona presence, and display corona image, ambient image, and said pan-and-tilt position of any detected corona to operator.

19. An automated corona survey system as in claim 18 wherein said UV survey camera comprises:
- an optical system configured to receive UV and visible light from said discharge corona;
- an optical filter configured to remove a portion of said UV and visible light leaving filtered light, said filtered light composed of corona light and ambient light;
- an image processor, said image processor configured to provide corona shutters during said discharge corona periods and ambient shutters between said discharge corona periods;
- an image sensor, said image sensor configured to capture corona-plus-ambient images when triggered by said corona shutters and ambient images when triggered by said ambient shutters;
- a phase reference, said phase reference provided by said AC power cable and configured to synchronize said corona shutters and said ambient shutters to said AC power system high voltage discharge corona; and
- a communications interface to said communications link.

20. An automated corona survey system as in claim 19 wherein said image processor comprises:
- an image subtractor configured to generate corona-only images by subtracting said ambient images from said corona-plus-ambient images;
- a corona integrator configured to generate corona frames by integrating one or more said corona-only images;
- an ambient integrator configured to generate ambient frames by integrating one or more said ambient images; and
- a pixel selector configured to produce display images by replacing said ambient frame pixels with said corona frame pixels.

* * * * *